United States Patent [19]
Webb et al.

[11] Patent Number: 5,228,950
[45] Date of Patent: Jul. 20, 1993

[54] DRY PROCESS FOR REMOVAL OF UNDESIRABLE OXIDE AND/OR SILICON RESIDUES FROM SEMICONDUCTOR WAFER AFTER PROCESSING

[75] Inventors: Jennifer M. Webb, San Jose; Chester A. Szwejkowski, Santa Cruz; Zahra H. Amini, Cupertino, all of Calif.

[73] Assignee: Applied Materials, Inc., Santa Clara, Calif.

[21] Appl. No.: 622,694

[22] Filed: Dec. 4, 1990

[51] Int. Cl.$^5$ .......................................... H01L 21/308
[52] U.S. Cl. ..................................... 156/643; 156/657
[58] Field of Search ............... 156/643, 646, 657, 662; 204/298.37

[56] References Cited

U.S. PATENT DOCUMENTS

| | | | |
|---|---|---|---|
| 4,568,410 | 2/1986 | Thornquist | 156/643 |
| 4,654,112 | 3/1987 | Douglas et al. | 156/643 |
| 4,786,360 | 11/1988 | Cote et al. | 156/643 |
| 4,787,957 | 11/1988 | Barkanic et al. | 156/643 |
| 4,799,991 | 1/1989 | Dockrey | 156/659.1 |
| 4,807,016 | 2/1989 | Douglas | 156/643 |
| 4,818,334 | 4/1989 | Shwartzman et al. | 156/659.1 |
| 4,837,180 | 6/1989 | Chao | 156/643 |
| 4,857,140 | 8/1989 | Loewenstein | 156/643 |
| 4,904,341 | 2/1990 | Blaugher et al. | 156/643 |
| 4,923,828 | 5/1990 | Gluck et al. | 156/643 |
| 4,943,344 | 7/1990 | Tachi et al. | 156/643 |
| 4,946,549 | 8/1990 | Bachman et al. | 156/655 |
| 4,960,488 | 10/1990 | Law et al. | 204/298.31 |
| 4,975,144 | 12/1990 | Yamazaki et al. | 156/643 |
| 4,983,253 | 1/1991 | Wolfe et al. | 156/345 |

FOREIGN PATENT DOCUMENTS

| | | | |
|---|---|---|---|
| 0251567 | 1/1988 | European Pat. Off. | 204/298.37 |
| 61-216326 | 9/1986 | Japan | 204/298.37 |
| 62-031126 | 2/1987 | Japan | 204/298.37 |
| 63-169376 | 7/1987 | Japan | 204/298.37 |
| 63-74322 | 7/1988 | Japan . | |
| 63-125809 | 7/1988 | Japan . | |

Primary Examiner—Brian E. Hearn
Assistant Examiner—George Goudreau
Attorney, Agent, or Firm—John P. Taylor

[57] ABSTRACT

A process is disclosed for the removal of residual oxide and/or silicon materials from a semiconductor wafer such as silicon-rich oxide residues or polysilicon stringers from the sidewalls of lines or steps formed over semiconductor wafers during the construction of integrated circuit structures without removing the wafer from the vacuum apparatus used in forming the lines on the wafer using a high pressure magnetically enhanced plasma etch using an $NF_3$-containing gas containing at least about 40 volume % $NF_3$ as the etchant gas.

23 Claims, 2 Drawing Sheets

---

A METHOD OF DRY ETCHING A SEMICONDUCTOR WAFER TO REMOVE OXIDE OR POLYSILICON RESIDUES FROM SIDEWALLS OF RAISED STEPS ON THE WAFER WHICH COMPRISES:

1. MOUNTING A SEMICONDUCTOR WAFER IN A VACUUM CHAMBER HAVING A PRESSURE RANGE OF FROM ABOUT 20 MILLITORR TO ABOUT 1 TORR ON A CATHODE MAINTAINED AT A TEMPERATURE OF FROM ABOUT −15° C TO ABOUT 150° C;

2. FLOWING A NITROGEN TRIFLUORIDE-CONTAINING GAS THROUGH THE CHAMBER AT A RATE EQUIVALENT TO FROM 10 TO 500 SCCM FLOWING THROUGH A 1200 CUBIC CENTIMETER CHAMBER;

3. IGNITING A PLASMA IN THE ETCH CHAMBER AND MAINTAINING IT AT A POWER LEVEL OF FROM ABOUT 50 TO ABOUT 400 WATTS; AND

4. IMMERSING THE WAFER IN A MAGNETIC FIELD HAVING A FIELD STRENGTH PARALLEL TO THE PLANE OF THE WAFER OF FROM ABOUT 25 TO ABOUT 150 GAUSS

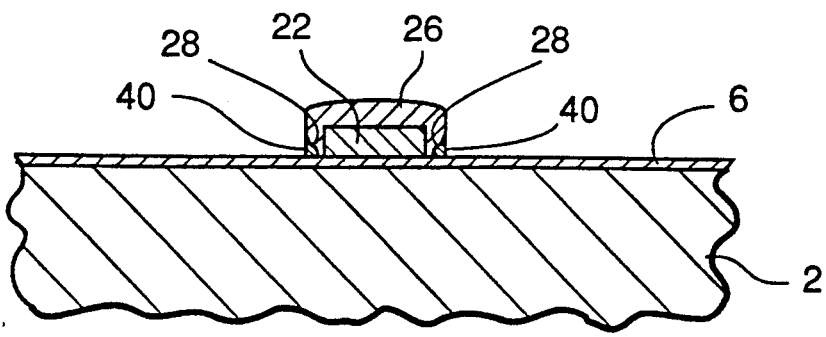

Figure 4 (PRIOR ART)

A METHOD OF DRY ETCHING A SEMICONDUCTOR WAFER TO REMOVE OXIDE OR POLYSILICON RESIDUES FROM SIDEWALLS OF RAISED STEPS ON THE WAFER WHICH COMPRISES:

1. MOUNTING A SEMICONDUCTOR WAFER IN A VACUUM CHAMBER HAVING A PRESSURE RANGE OF FROM ABOUT 20 MILLITORR TO ABOUT 1 TORR ON A CATHODE MAINTAINED AT A TEMPERATURE OF FROM ABOUT −15° C TO ABOUT 150° C;

2. FLOWING A NITROGEN TRIFLUORIDE-CONTAINING GAS THROUGH THE CHAMBER AT A RATE EQUIVALENT TO FROM 10 TO 500 SCCM FLOWING THROUGH A 1200 CUBIC CENTIMETER CHAMBER;

3. IGNITING A PLASMA IN THE ETCH CHAMBER AND MAINTAINING IT AT A POWER LEVEL OF FROM ABOUT 50 TO ABOUT 400 WATTS; AND

4. IMMERSING THE WAFER IN A MAGNETIC FIELD HAVING A FIELD STRENGTH PARALLEL TO THE PLANE OF THE WAFER OF FROM ABOUT 25 TO ABOUT 150 GAUSS

Figure 5

DRY PROCESS FOR REMOVAL OF UNDESIRABLE OXIDE AND/OR SILICON RESIDUES FROM SEMICONDUCTOR WAFER AFTER PROCESSING

BACKGROUND OF THE INVENTION

1. Field of the Invention

This invention relates to a etching process for the removal of oxide and/or silicon residues during the formation of integrated circuit structures on semiconductor wafers. In particular, this invention relates to a dry process for the removal of materials from the sidewalls of raised lines on semiconductor wafers using a high pressure magnetically enhanced plasma etch and a gaseous etchant containing $NF_3$ gas.

2. Description of the Related Art

During the construction of integrated circuit structures on and in a semiconductor wafer, undesirable oxide and/or silicon products or residues may be formed or left on the wafer. For example, during the formation of conductive polysilicon lines on the surface of a semiconductor wafer, such undesirable products or residues may be formed or left on the sidewalls of the resulting polysilicon line or lines.

For example, as shown in FIG. 1, when a polysilicon line 10 is formed over a gate oxide layer 6 on a silicon semiconductor wafer 2, by patterning a photoresist layer to form a photoresist mask 14 and then anisotropically etching an underlying polysilicon layer through the mask, a residue 20a may form on the sidewalls of polysilicon line 10, and a similar residue 20b may form on the sidewalls of photoresist mask 14. Such residue material is believed to be a form of a silicon-rich oxide, which is sometimes denoted as a fluffy oxide because of its appearance under a microscope due to its relative density when compared to thermal oxide and its etch rate in hydrofluoric acid. This residue material must be removed from the sidewalls, for example, when it is desired to form oxide sidewalls for insulation purposes, because it interferes with high quality oxidation processes since it protrudes above the poly line itself. This residue also creates adhesion problems for the next layer and can contaminate the diffusion furnaces in the next level processing if not removed.

In the past, removal of this oxide residue has been carried out by a wet etch process using HF. However, this necessitates removal of the wafer from a vacuum apparatus, which can introduce contamination, as well as slow down the throughput of the overall process for forming integrated circuit structures on the wafer. Furthermore, the use of HF will also attack the gate oxide, thus requiring very close monitoring of the wet etch step.

Oxide type residues are not the only form of residues which may be formed on the sidewalls of polysilicon lines on semiconductor wafers. For example, as shown in FIGS. 2–4, when forming a polysilicon line 30 on semiconductor wafer 2 over an oxide layer 26 which separates polysilicon line 30 from an underlying polysilicon line 22, the normal anisotropic etching of the upper polysilicon layer through a photoresist mask 36 can result in polysilicon residues or stringers 40 remaining on oxide layer 26 at 28 where oxide layer 26 necks down as it is formed over the sidewalls of lower polysilicon line 22. Such polysilicon stringers 40, if not removed, can form an undesirable short or conductive paths between two parallel polysilicon lines 30 formed over oxide layer 26, as best seen in FIG. 3.

As in the removal of the oxide residues, the current practice used to remove such undesirable polysilicon stringers is to remove the wafer from the vacuum apparatus and to subject it to a wet etch, usually a KOH etch, to remove the undesirable polysilicon.

However, when an etchant such as KOH is used to remove such undesirable polysilicon residues, great care must again be exercised in controlling the etch since the etchant will also attack the polysilicon line. In addition, in submicron geometries, wet chemicals may have problems penetrating high aspect ratio openings.

It would, therefore, be desirable to provide a dry etch process which could selectively remove such undesirable residues without the need to remove the semiconductor wafer from the vacuum chamber.

SUMMARY OF THE INVENTION

It is, therefore, an object of this invention to provide a process for the removal of materials from the sidewalls of raised lines formed on semiconductor wafers.

It is another object of this invention to provide a dry process for the removal of materials from the sidewalls of raised lines formed on semiconductor wafers using a high pressure plasma etch with an $NF_3$-containing etchant gas.

It is yet another object of this invention to provide a dry process for the removal of oxide residues from the sidewalls of raised lines formed on semiconductor wafers using a high pressure $NF_3$-containing plasma etch.

It is still another object of this invention to provide a dry process for the removal of polysilicon residues from the sidewalls of raised lines formed on semiconductor wafers using a high pressure $NF_3$-containing plasma etch.

These and other objects of the invention will be apparent from the following description and drawings.

BRIEF DESCRIPTION OF THE DRAWINGS

FIG. 4 is a vertical cross-sectional view of the prior art structure of FIG. 3 taken along lines IV—IV.

FIG. 5 is a flow sheet illustrating the process of the invention.

DETAILED DESCRIPTION OF THE INVENTION

The invention provides a dry process for the removal of residual materials from the sidewalls of lines or steps formed over semiconductor wafers without removing the wafer from the vacuum apparatus used in forming the lines on the wafer using a high pressure magnetically enhanced plasma etch utilizing an $NF_3$-containing gas as the etchant.

Figure 1:
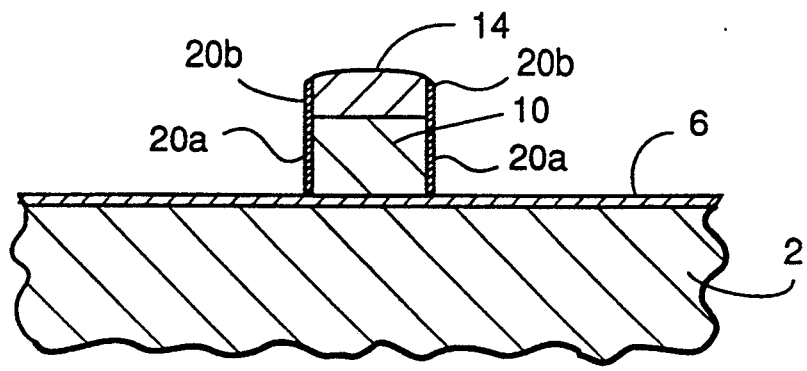
FIG. 1 is a vertical side section view of a prior art integrated circuit structure showing oxide residues on the sidewalls of a polysilicon line formed on a semiconductor wafer.

After forming a polysilicon line on a semiconductor wafer, such as shown in the prior art structure of FIG. 1, the silicon-rich oxides or oxide residues 20a and 20b, formed on the sidewalls of both polysilicon line 10 and photoresist mask 14, can be removed, in accordance with the invention, by subjecting the wafer to a high pressure magnetically enhanced $NF_3$ plasma etch in the same vacuum chamber used to form the polysilicon line.

The vacuum chamber is maintained within a pressure range of from about 20 milliTorr to about 1 Torr, preferably within a range of from about 100 milliTorr to about 400 milliTorr, and most preferably within a pressure range of from about 300 milliTorr to about 350 milliTorr during the etch. The cathode or wafer base on which the wafer is mounted within the vacuum chamber is maintained at a temperature which will provide a wafer temperature within a range of from about minus 25° C. to about 150° C., preferably within a range of from about 5° C. to about 65° C., and most preferably within a temperature range of from about 15° C. to about 25° C., during the etch.

For a vacuum chamber of about 1200 cc in volume, the total flow of $NF_3$-containing etchant gas into the vacuum chamber is maintained within a range of from about 10 to about 500 standard cubic centimeters per minute (sccm), preferably from about 150 to about 200 sccm. For a larger or smaller vacuum chamber, the flow of $NF_3$-containing etchant gas into the chamber would be adjusted proportionately.

The $NF_3$-containing etchant gas may comprise only $NF_3$ gas, or it may comprise a mixture which contains at least 40 volume %, and preferably at least 50 volume %, $NF_3$ gas, as well as one or more additional reactive gases and/or one or more carrier gases. Examples of other reactive gases which may be used in combination with the $NF_3$ etchant gas include $SF_6$, $Cl_2$, and $CF_4$. These gases, when present, may be used singly or in combination in amounts of up to 60 volume %, preferably 50 volume % total, with the balance consisting of $NF_3$ gas, i.e., the remaining 40 volume % or preferably 50 volume %. Examples of carrier gases which may be used include helium, oxygen, and argon, either singly or in combination, with the total amount of such carrier gas or gases also not exceeding 60 volume %, preferably 50 volume %, of the etchant gas mixture. When one or more additional reactive gases and one or more carrier gases are used in combination with the $NF_3$ gas, the total amount of all of these additional gases must also not exceed 60 volume %, preferably 50 volume %, with the balance consisting of $NF_3$ gas.

The etch process of the invention is carried out with the assistance of a plasma which is ignited within the chamber between the cathode and the chamber walls and maintained in the chamber during the etch at a power level ranging from about 50 to about 400 watts, depending upon the wafer diameter.

The etch is carried out under magnetic enhancement conditions by immersing the wafer in a magnetic field parallel to the plane of the wafer and having a field strength ranging from about 25 gauss to about 150 gauss or higher, preferably from about 100 gauss to about 125 gauss, using magnetic coils horizontally spaced around the outside walls of the vacuum chamber as is well known to those skilled in the art. Examples of such apparatus may be found in U.S. Pat. Nos. 4,668,338 and 4,842,683, both assigned to the assignee of this invention, and cross-reference to both of which is hereby made.

When removing oxide residues, the etch is carried out for a period of from about 5 seconds to about 60 seconds which is sufficient to remove the silicon-rich oxide residues from the sidewalls of the polysilicon line without damaging the remainder of the structure. It should be noted, in this regard, that close monitoring and control of the time period for the etch is very important since the etch system of the invention is capable of removing both polysilicon and oxide and damage to either the polysilicon line or the gate oxide on the wafer adjacent the polysilicon line could occur if the etch was carried out for an excessive period of time.

Figure 2:
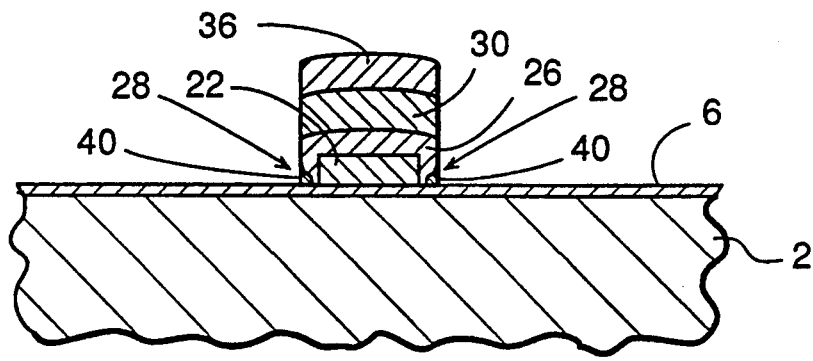
FIG. 2 is a vertical side section view of a prior art integrated circuit structure showing polysilicon residues or stringers remaining on or over the oxide sidewall over a polysilicon line or step on a semiconductor wafer when forming a second polysilicon line.
Figure 3:
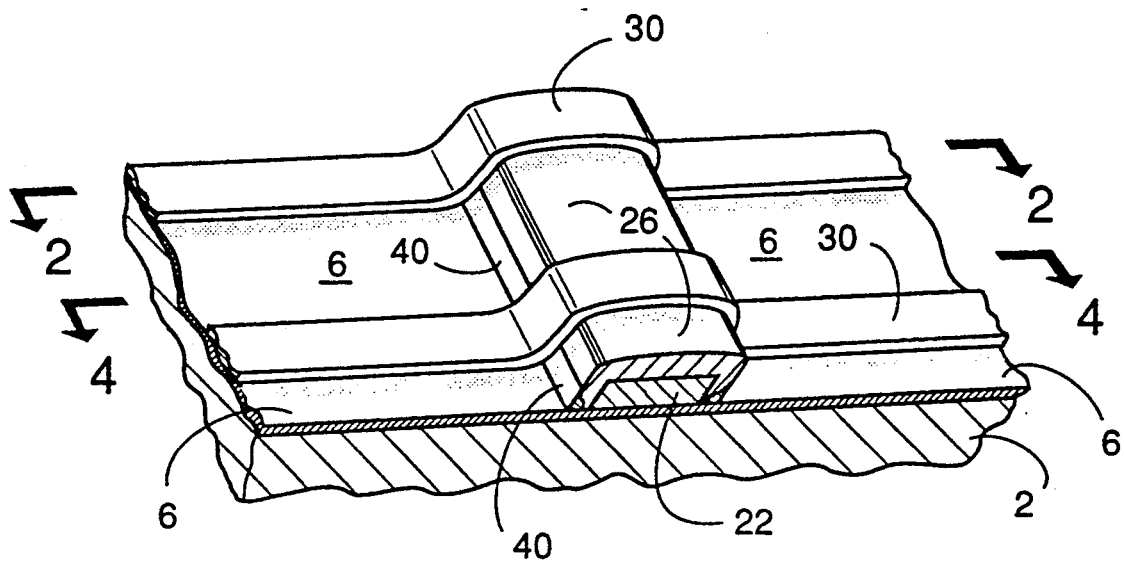
FIG. 3 is an isometric view of the prior art structure of FIG. 2 showing the polysilicon stringer extending between two parallel polysilicon lines to provide an electrical short between the lines.

The etch system of the invention may also be used to remove polysilicon residues or stringers from the reentrant portion of the step, such as polysilicon stringers 40 shown in FIGS. 2-4, formed when a first polysilicon line is formed on a semiconductor wafer, an oxide insulating layer is deposited or grown over the polysilicon line, and a second polysilicon layer is deposited over the oxide layer and then patterned to form a polysilicon line or lines at a second level.

When using the etch process of the invention to remove such polysilicon stringers or residues, rather than removal of the oxide residues described above, the etch conditions described above remain the same except that the time may be longer, i.e., up to about 120 seconds, and the polysilicon lines may be slightly re-entrant, i.e., undercut at the bottom edges. However, the etch time will still be significantly less than when a wet treatment is used.

As in the previous embodiment, accurate control and monitoring of the time of the etch during such polysilicon etching is important to prevent or inhibit excessive etching or removal of other portions of the integrated circuit structure already formed on the semiconductor wafer.

The following examples will serve to further illustrate the process of the invention:

EXAMPLE I

An integrated circuit structure on a 4" diameter semiconductor wafer was formed with a polysilicon layer applied thereon in a 1280 cc vacuum chamber followed by formation of a photoresist mask over the polysilicon layer. The polysilicon layer was conventionally etched in the vacuum chamber through the openings in the photoresist mask to form several polysilicon lines on the wafer, leaving silicon-rich oxide residues on the sidewalls of both the polysilicon lines and the photoresist mask.

The oxide residues were etched away by flowing 150 sccm of $NF_3$ into the vacuum chamber while maintaining the cathode base on which the wafer was mounted at a temperature of 20° C. and maintaining the pressure in the chamber at about 300 milliTorr. A plasma at a power level of 100 watts was ignited in the chamber during the etch and the wafer was immersed in a magnetic field of 120 gauss. After 15 seconds, the gas flow was stopped, the plasma extinguished, and the wafer was removed from the chamber and examined using an SEM microscope. No visible traces of oxide residues remained on the sidewalls of the polysilicon line.

EXAMPLE II

A second semiconductor wafer of 4" diameter, having a first level of polysilicon lines formed on the surface and an oxide insulating layer formed over the polysilicon lines, was placed in the vacuum apparatus and a second polysilicon layer was deposited on the oxide surface followed by formation of a photoresist mask over the polysilicon layer. The polysilicon layer was conventionally etched in the vacuum chamber to form a plurality of polysilicon lines over the oxide layer, leaving polysilicon stringers or residues in the reentrant portions of the oxide layer over the first level of polysilicon lines.

The polysilicon stringers or residues were etched away by flowing a gaseous mixture of 9 sccm of $NF_3$ plus 11 sccm of $Cl_2$ into the vacuum chamber while maintaining the cathode base on which the wafer was mounted at a temperature of 65° C. and maintaining the pressure in the chamber at about 80 milliTorr. A plasma at a power level of 80 watts was ignited in the chamber during the etch and the wafer was immersed in a magnetic field of 75 gauss. After −15 seconds, the gas flow was stopped, the plasma extinguished, and the wafer was removed from the chamber and examined using a SEM microscope. No visible traces of polysilicon were observed between the polysilicon lines on the surface of the oxide layer.

The $NF_3$-containing dry etch process of the invention may also be used for the removal of native oxide from silicon surfaces; for the removal of boron or phosphorus "skin", i.e., doped native oxide after implant and annealing steps; or for the removal of "fence", i.e., polysilicon spikes or residues left on the surface of an integrated circuit structure adjacent to—but not necessarily contiguous with the sidewall of a raised step.

Thus, the invention provides an improved process for removing undesirable oxide or polysilicon residues from an integrated circuit structure, such as from the sidewalls of steps such as polysilicon lines formed on semiconductor wafers without the need of removing the wafer from a vacuum chamber, i.e., a dry etching process which eliminates the need of removing the wafer from a vacuum chamber to conduct a wet etch to remove such residues. The result is a process which provides for speedier throughput of wafers with a lower risk of wafer contamination.

Having thus described the invention what is claimed is:

1. In a process for forming polysilicon lines over an oxide layer on an integrated circuit structure formed on a semiconductor wafer wherein a polysilicon layer on said oxide layer is patterned by etching through said polysilicon layer down to said underlying oxide layer whereby silicon-rich oxide residues from said etching step are deposited on the sidewalls of said polysilicon lines, the improvement which comprises: removing said silicon-rich oxide residues from said sidewalls by contacting said residues for from about 5 to about 60 seconds with an etchant gas containing at least 40 volume % $NF_3$ in an etchant chamber while maintaining said semiconductor wafer in said etchant chamber within a temperature range of from about −25° C. to about 150° C.

2. The process of claim 1 wherein at least 50 volume % of said $NF_3$-containing etchant gas in said chamber consists of $NF_3$.

3. The process of claim 1 wherein the balance of said etchant gas consists essentially of one or more gases selected from the group consisting of argon, helium, oxygen, $SF_6$, $Cl_2$, and $CF_4$.

4. The process of claim 3 wherein a plasma is maintained in said vacuum chamber during said etch at a power level ranging from about 50 to about 400 watts.

5. The process of claim 4 wherein said etch is carried out while immersing said wafer in a magnetic field parallel to the plane of the wafer and having a field strength of at least about 25 gauss.

6. The process of claim 5 wherein said vacuum chamber is maintained at a pressure ranging from about 20 milliTorr to about 1 Torr during said etch.

7. The process of claim 6 wherein said wafer is maintained at a temperature of from about 5° C. to about 65° C. during said etch.

8. The process of claim 4 wherein said etch is carried out while immersing said wafer in a magnetic field parallel to the plane of the wafer and having a field strength of from about 25 gauss to about 150 gauss.

9. The process of claim 5 wherein said vacuum chamber is maintained at a pressure ranging from about 100 milliTorr to about 400 milliTorr during said etch.

10. The process of claim 5 wherein said vacuum chamber is maintained at a pressure ranging from about 300 milliTorr to about 350 milliTorr during said etch.

11. The process of claim 6 wherein said wafer is maintained at a temperature of from about 15° C. to about 25° C. during said etch.

12. The process of claim 6 wherein said $NF_3$-containing gas is flowed into said chamber at a rate equivalent to from about 10 to about 500 sccm flowing into a 1200 cc. chamber.

13. The process of claim 6 wherein said $NF_3$-containing gas is flowed into said chamber at a rate equivalent to from about 150 to about 200 sccm flowing into a 1200 cc. chamber.

14. The process of claim 1 wherein the balance of said etchant gas consists essentially of one or more carrier gases selected from the group consisting of argon, helium, and oxygen.

15. The process of claim 1 wherein the balance of said etchant gas consists essentially of one or more reactive gases selected from the group consisting of $SF_6$, $Cl_2$, and $CF_4$.

16. In a process for forming polysilicon lines on an oxide layer formed over underlying steps on an integrated circuit structure formed on a semiconductor wafer wherein a polysilicon layer on said oxide layer is patterned by etching through said polysilicon layer down to said underlying oxide layer and wherein polysilicon stringers remain on said oxide layer between adjacent polysilicon lines formed from said polysilicon layer at a position where said oxide layer passes over said underlying steps after said etching step to form said polysilicon lines, the improvement which comprises: removing said polysilicon stringers on said oxide layer by contacting said stringers for from about 5 to about 120 seconds with an etchant gas containing at least 40 volume % $NF_3$ in an etchant chamber while maintaining said semiconductor wafer in said etchant chamber within a temperature range of from about −25° C. to about 150° C.

17. An improvement in the process for forming polysilicon lines over an oxide layer on an integrated circuit structure formed on a semiconductor wafer wherein a polysilicon layer on said oxide layer is patterned by etching through said polysilicon layer down to said underlying oxide layer whereby silicon-rich oxide residues from said etching step are deposited on the sidewalls of said polysilicon lines, the improvement comprising removing said silicon-rich oxide residues from said sidewalls by the steps of:

(a) mounting said wafer on a cathode capable of maintaining a wafer temperature of from about −5° C. to about 150° C. in a vacuum etch chamber maintained at a pressure within a range of from about 20 milliTorr to about 1 Torr;

b) flowing into said etch chamber at a rate equivalent to from about 10 to about 500 sccm flowing into a 1200 cc. vacuum chamber, an $NF_3$-containing etchant gas containing at least 40 volume % $NF_3$ with the balance consisting essentially of one or more gases selected from the group consisting of argon, helium, oxygen, $SF_6$, $Cl_2$, and $CF_4$;

c) igniting a plasma in said chamber and maintaining it at a power level ranging from about 50 to about 400 watts while said $NF_3$-containing etchant gas is flowing into said chamber;

d) immersing said wafer in said chamber in a magnetic field parallel to the plane of said wafer at a field strength of at least about 25 gauss during said etch; and e) etching said sidewalls of said polysilicon lines for a period of from about 5 to about 60 seconds to remove said silicon-rich oxide residues from said sidewalls of said polysilicon lines.

18. The process of claim 17 wherein said pressure is maintained in said vacuum chamber during said etch at a level ranging from about 100 milliTorr to about 400 milliTorr.

19. The process of claim 17 wherein said magnetic field has a field strength ranging from about 25 gauss to about 150 gauss.

20. The process of claim 17 wherein said wafer is maintained at a temperature of from about 5° C. to about 65° C. during said etch.

21. The process of claim 17 wherein said $NF_3$-containing gas is flowed into said chamber at a rate equivalent to from about 150 to about 200 sccm flowing into a 1200 cc. chamber.

22. An improvement in the process for forming polysilicon lines over an oxide layer on an integrated circuit structure formed on a semiconductor wafer wherein a polysilicon layer on said oxide layer is patterned into raised polysilicon lines on said integrated circuit structure by etching through said polysilicon layer down to said underlying oxide layer whereby silicon-rich oxide residues from said etching step are deposited on the sidewalls of said polysilicon lines, the improvement comprising removing said silicon-rich oxide residues from said sidewalls by the steps of:

a) mounting said wafer on a cathode capable of maintaining a wafer temperature of from about 5° C. to about 65° C. in a vacuum chamber maintained at a pressure within a range of from about 100 milliTorr to about 400 milliTorr;

b) flowing into said chamber at a rate equivalent to from about 150 to about 200 sccm flowing into a 1200 cc. vacuum chamber, an $NF_3$-containing etchant gas containing at least 50 volume % $NF_3$ with the balance consisting essentially of one or more gases selected from the group consisting of argon, helium, oxygen, $SF_6$, $Cl_2$, and $CF_4$;

c) igniting a plasma in said chamber and maintaining it at a power level ranging from about 50 to about 400 watts while said $NF_3$ gas is flowing into said chamber;

d) immersing said wafer in said chamber in a magnetic field parallel to the plane of said wafer at a field strength of from about 25 gauss to about 150 gauss during said etch; and e) maintaining said etch conditions for a time period of from about 5 to about 60 seconds;

to thereby remove said silicon-rich oxide residues from said sidewalls of said polysilicon lines.

23. In a process for forming overlying polysilicon lines on an oxide layer formed over underlying polysilicon lines on an integrated circuit structure formed on a semiconductor wafer wherein a polysilicon layer on said oxide layer is patterned by etching through said polysilicon layer down to said underlying oxide layer and wherein polysilicon stringers remain on said oxide layer between adjacent overlying polysilicon lines formed from said polysilicon layer at a position where said oxide layer passes over said underlying polysilicon lines after said etching step to form said overlying polysilicon lines, the improvement which comprises:

a) mounting said wafer on a cathode capable of maintaining a wafer temperature of from about 5° C. to about 65° C. in a vacuum chamber maintained at a pressure within a range of from about 100 milliTorr to about 400 milliTorr;

b) flowing into said chamber at a rate equivalent to from about 10 to about 500 sccm flowing into a 1200 cc. vacuum chamber, an $NF_3$-containing etchant gas containing at least 50 volume % $NF_3$ with the balance consisting essentially of one or more gases selected from the group consisting of argon, helium, oxygen, $SF_6$, $Cl_2$, and $CF_4$;

c) igniting a plasma in said chamber and maintaining it at a power level ranging from about 50 to about 400 watts while said $NF_3$ gas is flowing into said chamber;

d) immersing said wafer in said chamber in a magnetic field parallel to the plane of said wafer at a field strength of from about 25 gauss to about 150 gauss during said etch; and e) maintaining said etch conditions for a time period of from about 5 to about 120 seconds.

* * * * *